United States Patent [19]

Asazawa

[11] Patent Number: 4,797,576
[45] Date of Patent: Jan. 10, 1989

[54] FLIP-FLOP CIRCUIT WITH SHORT PROPAGATION DELAY

[75] Inventor: Hiroshi Asazawa, Tokyo, Japan

[73] Assignee: NEC Corporation, Japan

[21] Appl. No.: 81,877

[22] Filed: Aug. 5, 1987

[30] Foreign Application Priority Data

Aug. 18, 1986 [JP] Japan .................................. 61-191616

[51] Int. Cl.[4] ........................ H03K 3/284; H03K 3/29
[52] U.S. Cl. ................................. 307/272.1; 307/291;
307/445; 377/116
[58] Field of Search ...................... 307/445, 291, 272.1,
307/272.2, 247.1, 279, 440, 480; 377/116, 117

[56] References Cited

U.S. PATENT DOCUMENTS 4,297,591 10/1981 Roesler et al. ........................ 377/117
4,477,738 10/1984 Kouba ................................... 307/445
4,506,167 3/1985 Little et al. ..................... 307/272.2 X
4,638,183 1/1987 Rickard et al. ....................... 307/291

Primary Examiner—Stanley D. Miller
Assistant Examiner—Timothy P. Callahan
Attorney, Agent, or Firm—Laff, Whitesel, Conte & Saret

[57] ABSTRACT

In a flip-flop circuit, input and output terminals of two inverters connected between corresponding data input terminals and corresponding data output terminals are cross-connected. Latch switches are inserted between the inverters and the corresponding data input terminals. Hold switches are inserted in the cross-connected portion of the two inverters. The latch switches are turned on/off in synchronism with a latch input while the hold switches are turned on/off in synchronism with a hold input.

2 Claims, 6 Drawing Sheets

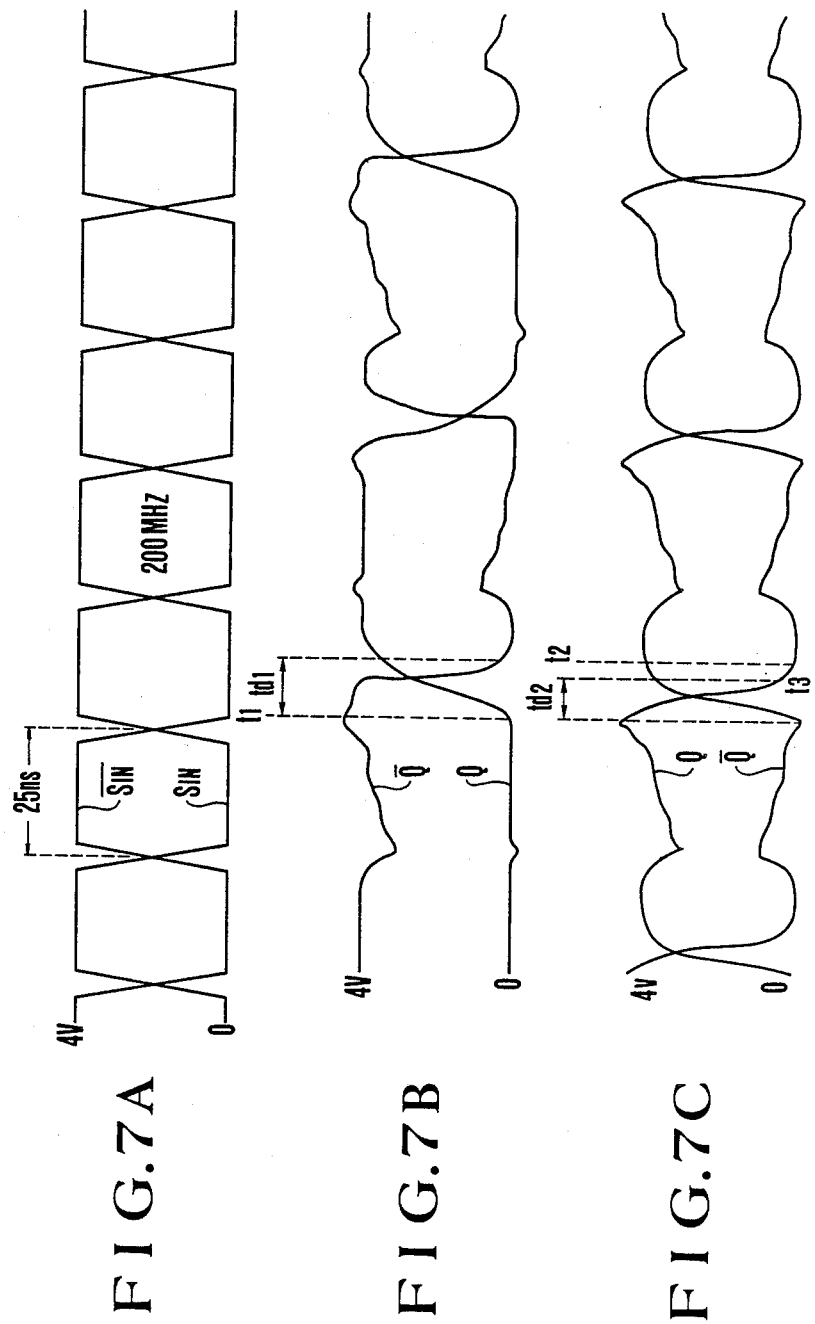

FLIP-FLOP CIRCUIT WITH SHORT PROPAGATION DELAY

BACKGROUND OF THE INVENTION

The present invention relates to a flip-flop circuit and, more particularly, to a flip-flop circuit having a short signal propagation delay time.

FIG. 1 shows a static flip-flop circuit according to a conventional technique. In FIG. 1, the flip-flop circuit is constituted by two inverters 21 and 22, and two switches 23 and 24. In this flip-flop circuit, the switch 23 is operated in response to an input to a latch input terminal 26 to read a signal at a data input terminal 25, and the switch 24 is operated in response to an input to a hold input terminal 27 to hold the data.

FIG. 2 shows the operation of the circuit shown in FIG. 1. Since the flip-flop circuit in FIG. 1 performs a static operation by holding the data using the two inverters 21 and 22, delay times TD1 and TD2 of the two inverters are added to switching operation time, thereby increasing a total delay time, as shown in a timing chart in FIG. 2.

FIG. 3 shows a dynamic flip-flop circuit as another conventional example. Referring to FIG. 3, the flip-flop circuit is constituted by an inverter 31 and a switch 32. In the flip-flop circuit, the switch 32 is operated in response to an input to a latch input terminal 35 to read a signal at a data input terminal 34, and information is held by a capacitor 37 connected to the input of the inverter 31. The held information is then held by the next flip-flop circuit by a switch 33 operated in response to an input to an input terminal 36.

A total delay time of the flip-flop circuit having the above arrangement is determined by a delay time of the inverter 31. However, a loss of information may occur at a low frequency eecause the information held by capacitor 37 is discharged at the low frequency. Accordingly, operation at a low frequency cannot be performed.

SUMMARY OF THE INVENTION

It is an object of the present invention to provide a static flip-flop circuit in which the above-described conventional drawbacks are eliminated and the operation speed is increased by shortening the delay time.

A flip-flop circuit according to the present invention comprises a first input terminal for receiving a first input data signal, a second input terminal for receiving a second input data signal which is a complement of the first input data signal, first and second output terminals for outputting first and second output data signals, first and second inverters whose output terminals are respectively connected to the first and second output terminals, first and second switches respectively inserted between the first data input terminal and the input terminal of the first inverter, and between the second input terminal and the input terminal of the second inverter, the first and second switches being controlled by a latch signal so as to be synchronously turned on/off, and third and fourth switches inserted between the input terminal of the first inverter and the output terminal of the second inverter, and between the input terminal of the second inverter and the output terminal of the first inverter, the third and fourth switches being controlled by a hold signal so as to be synchronously turned on/-off.

BRIEF DESCRIPTION OF THE DRAWINGS

FIGS. 7A, 7B, and 7C are timing charts of signals having simulation waveforms showing a comparison between the present invention and the conventional example when a frequency of an input data signal is 200 MHz;

DETAILED DESCRIPTION OF THE PREFERRED EMBODIMENTS

Figure 4:
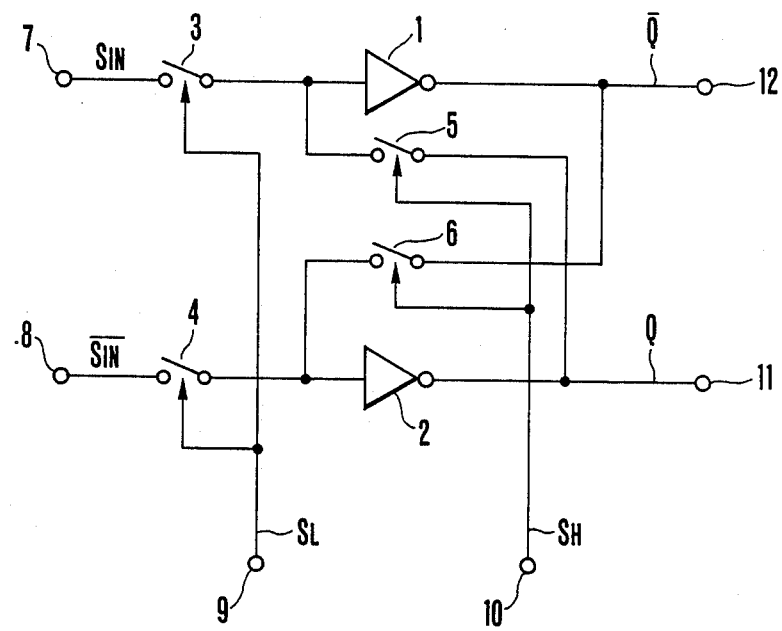
FIG. 4 is a circuit diagram showing a basic arrangement of a flip-flop circuit according to an embodiment of the present invention.

The present invention will be described in detail with reference to the accompanying drawings. FIG. 4 is a circuit diagram showing a basic arrangement of a flip-flop circuit according to an embodiment of the present invention.

The flip-flop circuit shown in FIG. 4 comprises inverters 1 and 2, switches 3, 4, 5, and 6, input terminals 7, 8, 9, and 10 for respectively receiving an input data signal $S_{IN}$, an input data signal $S_{In}$ which is a complement of input data signal $S_{IN}$, a latch signal $S_L$, and, a hold signal $S_H$, and output terminals 11 and 12 for respectively outputting an output signal Q and an output signal $\overline{Q}$ which is a complement of the output signal Q. The latch signal $S_L$ and the hold signal $S_H$ are complements of each other.

The switches 3 and 4 synchronously connect/disconnect the input terminal 7 to/from the input terminal of the inverter 1, and the input terminal 8 to/from the input terminal of the inverter 2, respectively, in response to the latch signal $S_L$ from the input terminal 9.

The output terminals of the inverters 1 and 2 are connected to the data output terminals 12 and 11, respectively.

The switches 5 and 6 synchronously connect/disconnect the input terminal of the inverter 1 to/from the output terminal of the inverter 2, and the input terminal of the inverter 2 to/from the output terminal of the inverter 1, respectively, in response to the hold signal $S_H$ from the input terminal 10.

Figure 5:
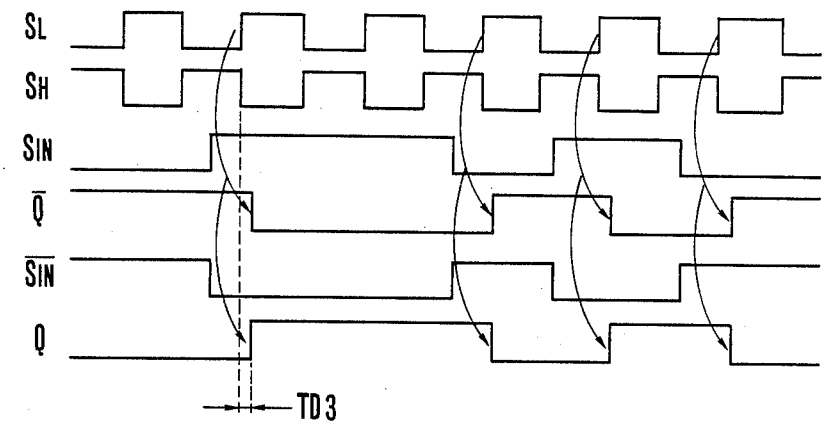
FIG. 5 is a timing chart for explaining the operation of the circuit in FIG. 4.

FIG. 5 is a timing chart of signals for explaining the operation of the flip-flop circuit in FIG. 4.

When the latch signal $S_L$ is set at high level, the switches 3 and 4 are turned on to supply information obtained at the input terminals 7 and 8 to the inverters 1 and 2, respectively. The information signals are inverted by the inverters 1 and 2 and supplied to the data output terminals 12 and 11, respectively. When the hold signal $S_H$ is set at high level, the switches 5 and 6 are turned on to hold the complementary data outputs.

According to this flip-flop circuit, data hold is performed in the static operation, and hence a loss of information does not occur while an operation can be performed at a low frequency. In addition, the delay times of the output signals Q and $\overline{Q}$ are equal to those of the inverters 2 and 1, respectively, thereby shortening a total delay time.

Figure 6:
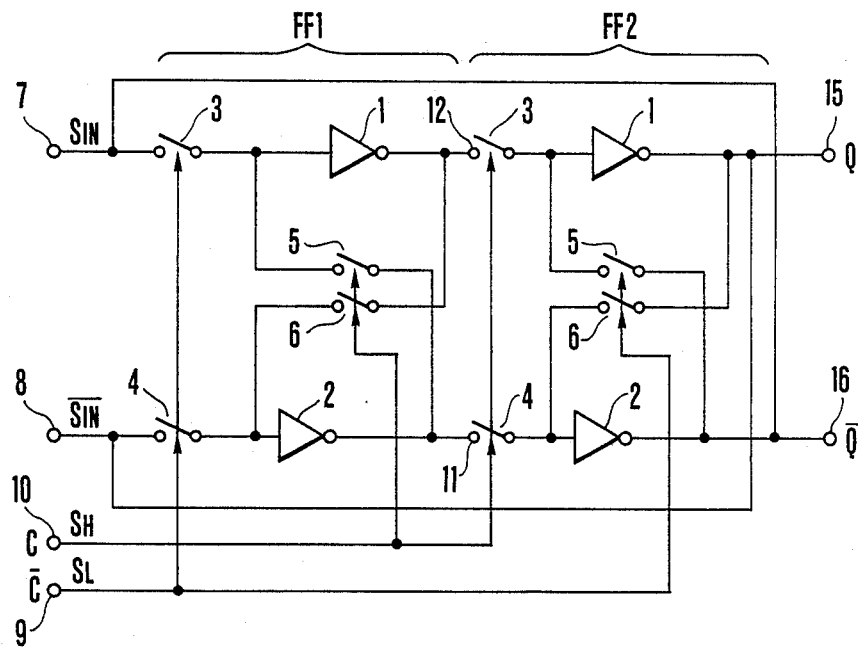
FIG. 6 is a circuit diagram showing another embodiment of the present invention.

FIG. 6 shows an arrangement of a master-slave flip-flop circuit according to another embodiment using two flip-flop circuits in FIG. 4. The same reference numerals in FIG. 6 denote the same parts as in FIG. 4. Output terminals 12 and 11 of inverters 1 and 2 in a first flip-flop circuit FF1 are connected to switches 3 and 4 in a second flip-flop circuit FF2, respectively. Output terminals 15 and 16 of the flip-flop circuit FF2 are connected to input terminals 8 and 7 of the first flip-flop circuit FF1, respectively. Output data Q and $\overline{Q}$ are output from the output terminals 15 and 16.

The flip-flop circuit in FIG. 6 constitutes a ½ frequency divider of a T flip-flop circuit by feeding back converted outputs to input terminals.

Figure 1:
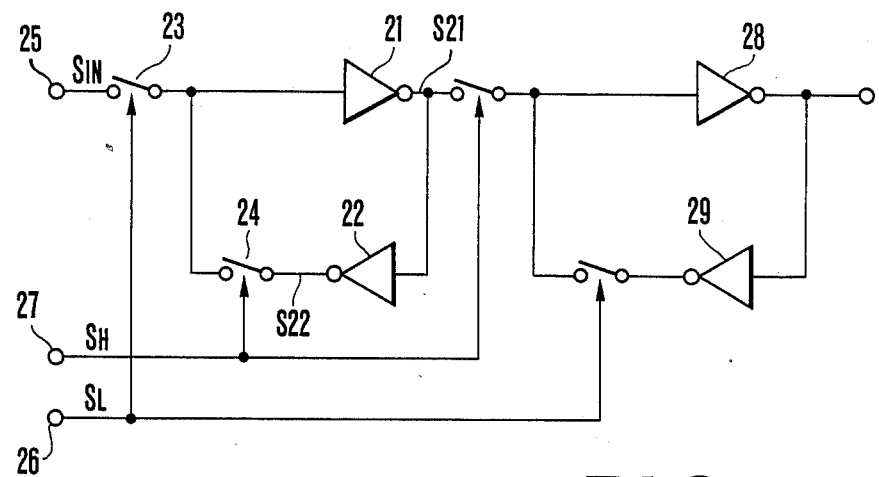
FIG. 1 is a circuit diagram showing a conventional flip-flop circuit.
Figure 2:
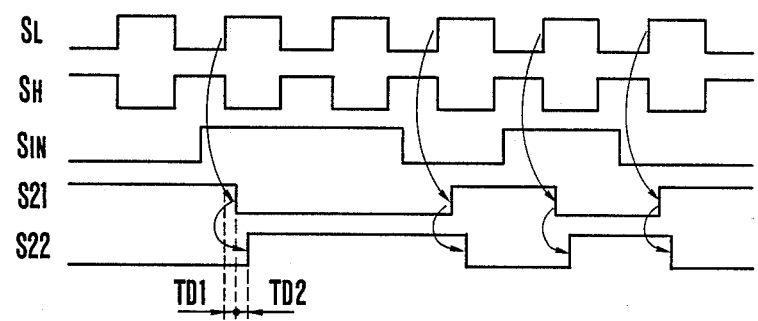
FIG. 2 is a timing chart for explaining the operation of the circuit in FIG. 1.
Figure 3:
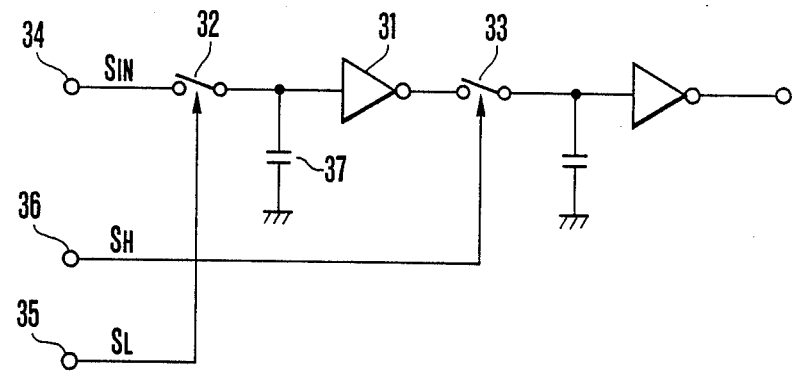
FIG. 3 is a circuit diagram showing another conventional flip-flop circuit.

FIGS. 7A to 7C show the results obtained by comparing the ½ frequency dividers of a T flip-flop modified the circuit in FIG. 1 by connecting the output terminal of inverter 29 with the input terminal 25 and the T flip-flop shown in FIG. 6 with each other by computer simulation when a frequency of each input data is 200 MHz. FIG. 7A shows input data signals $S_{IN}$ and $\overline{S_{IN}}$. FIGS. 7B and 7C show the output waveforms of the conventional flip-flop circuit and the flip-flop circuit of the present invention in FIG. 6, respectively.

In FIGS. 7B and 7C, expected maximum operation frequencies of the conventional flip-flop circuit and the flip-flop circuit of the present invention in FIG. 6, which are determined on the basis of delay times $t_{d1}$ and $t_{d2}$ from a change timing $t_1$ of the input signal to 80% inversion points $t_2$ and $t_3$ of the output signals, are:

$$f_{max1} = \tfrac{1}{2}t_{d1} = 1/(2 \times 1.08 \ ns) = 462 \text{ MHz}$$

$$f_{max2} = \tfrac{1}{2}t_{d2} = 1/(2 \times 0.75 \ ns) = 667 \text{ MHz}$$

Thus, it was confirmed that the operation speed of the flip-flop circuit of the present invention was 1.5 times that of the conventional flip-flop circuit.

Figure 8A:
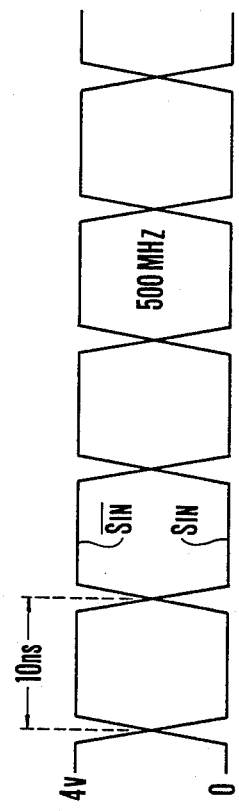
FIGS. 8A, 8B, and 8C are timing charts of signals having simulation waveforms showing a comparison between the present invention and the conventional example when a frequency of an input data signal is 500 MHz.
Figure 8B:
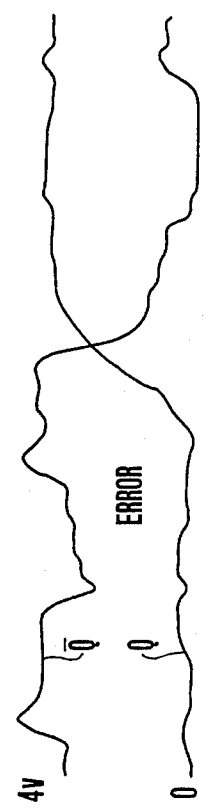
Figure 8C:
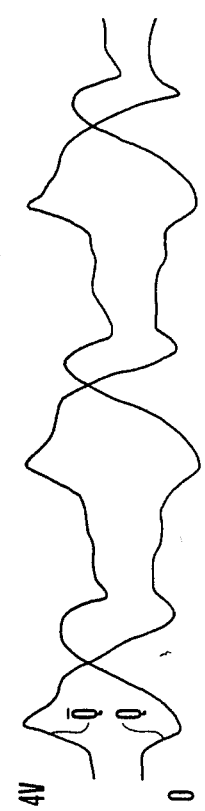

FIGS. 8A to 8C show the results obtained by comparing the conventional technique with the present invention by computer simulation in the same manner as described above. FIG. 8A shows input data signals $S_{IN}$ and $\overline{S_{IN}}$ having a frequency of 500 MHz. FIGS. 8B and 8C show the output waveforms of the conventional flip-flop circuit and the flip-flop citcutt in FIG. 6, respectively. As is apparent from FIGS. 8B and 8C, an operation failure occurs in the conventional circuit at 500 MHz, while the flip-flop circuit according to the present invention is normally operated.

Figure 9:
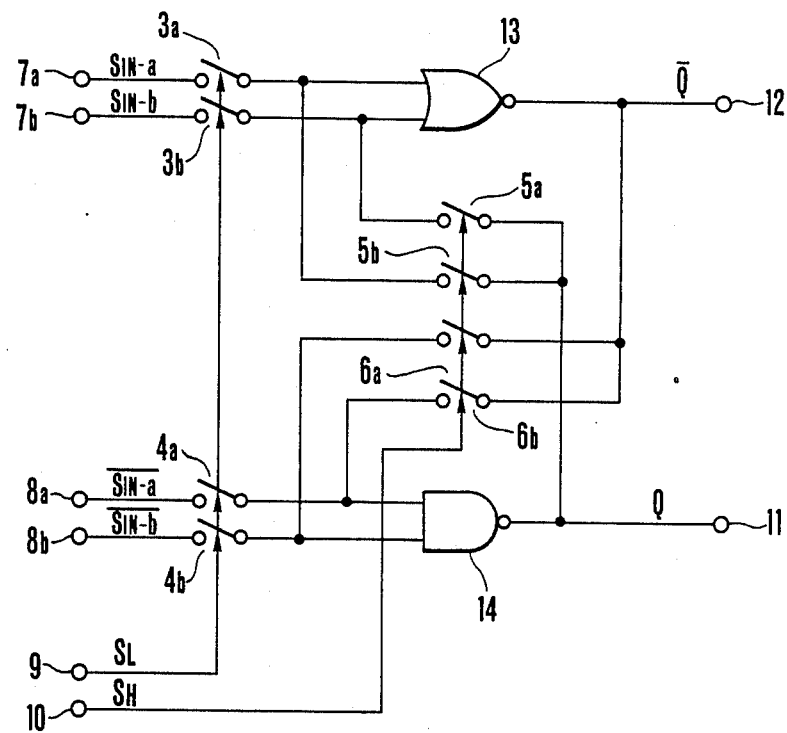
FIG. 9 is a circuit diagram showing still another embodiment of the present invention.

FIG. 9 shows still another embodiment of the present invention.

A flip-flop circuit in FIG. 9 receives a pair of input data signals $S_{IN-a}$ and $S_{IN-b}$ and a pair of complementary input data signals $\overline{S_{IN-a}}$ and $\overline{S_{IN-b}}$, and outputs output data Q and $\overline{Q}$.

In FIG. 9, input terminals 7a and 7b serve to receive the input data signals $S_{IN-a}$ and $S_{IN-b}$, respectively, and are connected to the two input terminals of a NOR gate 13 via switches 3a and 3b. Input terminals 8a and 8b serve to receive the input data signals $\overline{S_{IN-a}}$ and $\overline{S_{IN-b}}$, respectively, and are connected to the two input terminals of a NAND gate 14 via switches 4a and 4b. The switches 3a, 3b, 4a, and 4b are controlled by a latch signal $S_L$ to be synchronously turned on/off. The two input terminals of the NOR gate 13 are commonly connected to the output terminal of the NAND gate 14 via the switches 5a and 5b. The two input terminals of the NAN gate are commonly connected to the output terminal of the NOR gate 13 via switches 6a and 6b. The switches 5a, 5b, 6a, and 6b are controlled by a hold signal $S_H$ to be synchronously turned on/off.

According to the flip-flop circuit, NAND and NOR outputs can be respectively obtained at the output terminals 11 and 12 by applying the input data signals $S_{IN-a}$ and $S_{IN-b}$ to the input terminals 7a and 7b, respectively, and applying the input data signals $\overline{S_{IN-a}}$, $\overline{S_{IN-b}}$ to the input terminals 8a and 8b, respectively.

A delay time of the flip-flop circuit according to the present invention is determined by that of a single inverter in spite of its static operation. Therefore, problems such as loss of information can be solved, and operation at a low frequency can be performed while realizing a high-speed, reliable operation.

What is claimed is:

1. A flip-flop circuit comprising:
a first pair of input terminals for respectively receiving a first pair of input data signals;
a second pair of input terminals for respectively receiving a second pair of input data signals which pair is complement of the first pair of input data signals;
first and second output terminals;
a NOR gate whose output terminal is connected to said first output terminal;
a NAND gate whose output terminal is connected to said second output terminal;
two pairs of latch switches respectively inserted between said first pair of input terminals and two input terminals of said NOR gate, and between said second pair of input terminals and two input terminals of said NAND gate, said two pairs of latch switches being controlled by a latch signal to be turned on/off; and
two pairs of hold switches respectively inserted between said two input terminals of said NOR gate and said output terminal of said NAND gate and between said two input terminals of said NAND gate and said output terminal of said NOR gate, said two pairs of hold switches being controlled by a hold signal to be synchronously turned on/off.

2. A flip-flop circuit comprising:
NOR gate means;
NAND gate means;
feedback switching means responsive to a first control signal for selectively coupling an output of said NOR gate means to two inputs of said NAND gate means and an output of said NAND gate means to two inputs of said NOR gate means; and
input switching means responsive to a second control signal for selectively providing first and second pairs of input signals to two inputs of said NOR gate means and the two imputs of said NAND gate means, respectively, said first and second pair of input signals being substantially logical complements of each other, said first and second control signals being substantially logical complements of each other.

* * * * *